(12) United States Patent
Omstead et al.

(10) Patent No.: US 9,460,961 B2
(45) Date of Patent: Oct. 4, 2016

(54) TECHNIQUES AND APPARATUS FOR ANISOTROPIC METAL ETCHING

(71) Applicant: Varian Semiconductor Equipment Associates, Inc., Gloucester, MA (US)

(72) Inventors: Thomas R. Omstead, Gloucester, MA (US); Tristan Ma, Lexington, MA (US); Ludovic Godet, Sunnyvale, CA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 0 days.

(21) Appl. No.: 14/452,153

(22) Filed: Aug. 5, 2014

(65) Prior Publication Data

US 2016/0042922 A1   Feb. 11, 2016

(51) Int. Cl.
| | |
|---|---|
| H01L 21/461 | (2006.01) |
| H01L 21/768 | (2006.01) |
| H01J 37/32 | (2006.01) |
| H01L 21/3213 | (2006.01) |

(52) U.S. Cl.
CPC ... *H01L 21/76892* (2013.01); *H01J 37/32366* (2013.01); *H01J 37/32422* (2013.01); *H01L 21/32135* (2013.01); *H01L 21/32139* (2013.01); *H01J 2237/3341* (2013.01)

(58) Field of Classification Search
CPC .............. H01L 21/67069; H01L 21/76892; H01L 21/32139; H01J 2237/1502; H01J 2237/334; H01J 37/32412; H01J 37/32623; H01J 2237/3341
USPC ............ 216/13, 66, 105, 106; 438/689, 706, 438/712; 156/345.4
See application file for complete search history.

(56) References Cited

U.S. PATENT DOCUMENTS

| | | | | |
|---|---|---|---|---|
| 5,431,774 | A * | 7/1995 | Douglas | C23F 4/00 216/107 |
| 6,335,062 | B1 * | 1/2002 | Sartwell | C23C 14/48 427/527 |
| 8,008,207 | B2 * | 8/2011 | Yu | G03F 7/2043 438/705 |
| 2001/0055649 | A1 * | 12/2001 | Ogure | C23C 16/18 427/248.1 |
| 2013/0075248 | A1 * | 3/2013 | Hara | C23F 4/02 204/192.34 |
| 2014/0262755 | A1 | 9/2014 | Deshmukh et al. | |
| 2015/0011093 | A1 | 1/2015 | Singh et al. | |

* cited by examiner

*Primary Examiner* — Nadine Norton
*Assistant Examiner* — Christopher Remavege

(57) ABSTRACT

In one embodiment, a method for etching a copper layer disposed on a substrate includes directing reactive ions to the substrate when a mask that defines an exposed area and protected area is disposed on the copper layer, wherein an altered layer is generated in the exposed area comprising a chemically reactive material; and exposing the copper layer to a molecular species that is effective to react with the chemically reactive material so as to remove the altered layer.

12 Claims, 6 Drawing Sheets

TECHNIQUES AND APPARATUS FOR ANISOTROPIC METAL ETCHING

FIELD

The present embodiments relate to substrate processing, and more particularly, to techniques and processing apparatus for etching metal layers.

BACKGROUND

As semiconductor devices scale to smaller dimensions, metal interconnects that form part of device circuitry are also scaling to smaller dimensions. In order to maintain the resistance-capacitance (RC) delay at acceptable levels it may be useful to reduce the materials resistance in a metal interconnect. However, conventional metal interconnects such as copper interconnects are formed using a dual Damascene process in which copper is deposited into patterned features where interconnect lines are to be formed. This may limit the grain size of the copper material, which may increase resistivity due to grain boundary scattering, among other phenomena. This smaller grains size may in turn raise the RC delay and hence limit the speed of the circuits.

In principle, larger-grain metal materials such as copper may be formed if a metal is deposited as a blanket layer. However, if metal is first deposited as a blanket layer, formation of interconnect wiring entails etching of the metal layer after deposition to pattern the metal layer. It is with respect to these and other considerations that the present improvements have been needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment a method for etching a copper layer disposed on a substrate includes directing reactive ions to the substrate when a mask that defines an exposed area and protected area is disposed on the copper layer, wherein an altered layer is generated in the exposed area comprising a chemically reactive material. The method may further include exposing the copper layer to a molecular species that is effective to react with the chemically reactive material so as to remove the altered layer.

In another embodiment a processing apparatus may include a plasma chamber configured to generate a plasma comprising reactive ions. The processing apparatus may also include an extraction aperture to direct the reactive ions to a substrate over trajectories that form a non-zero angle with respect to a perpendicular to a substrate plane. The processing apparatus may also include an extraction voltage supply to impart an ion energy to the reactive ions sufficient to implant into a metal layer disposed on the substrate to form an altered layer comprising a chemically reactive material. The processing apparatus may also include a molecular source to provide a molecular species to the substrate that is effective to react with the chemically reactive material so as remove the altered layer from the metal layer.

DETAILED DESCRIPTION

Figure 1A:
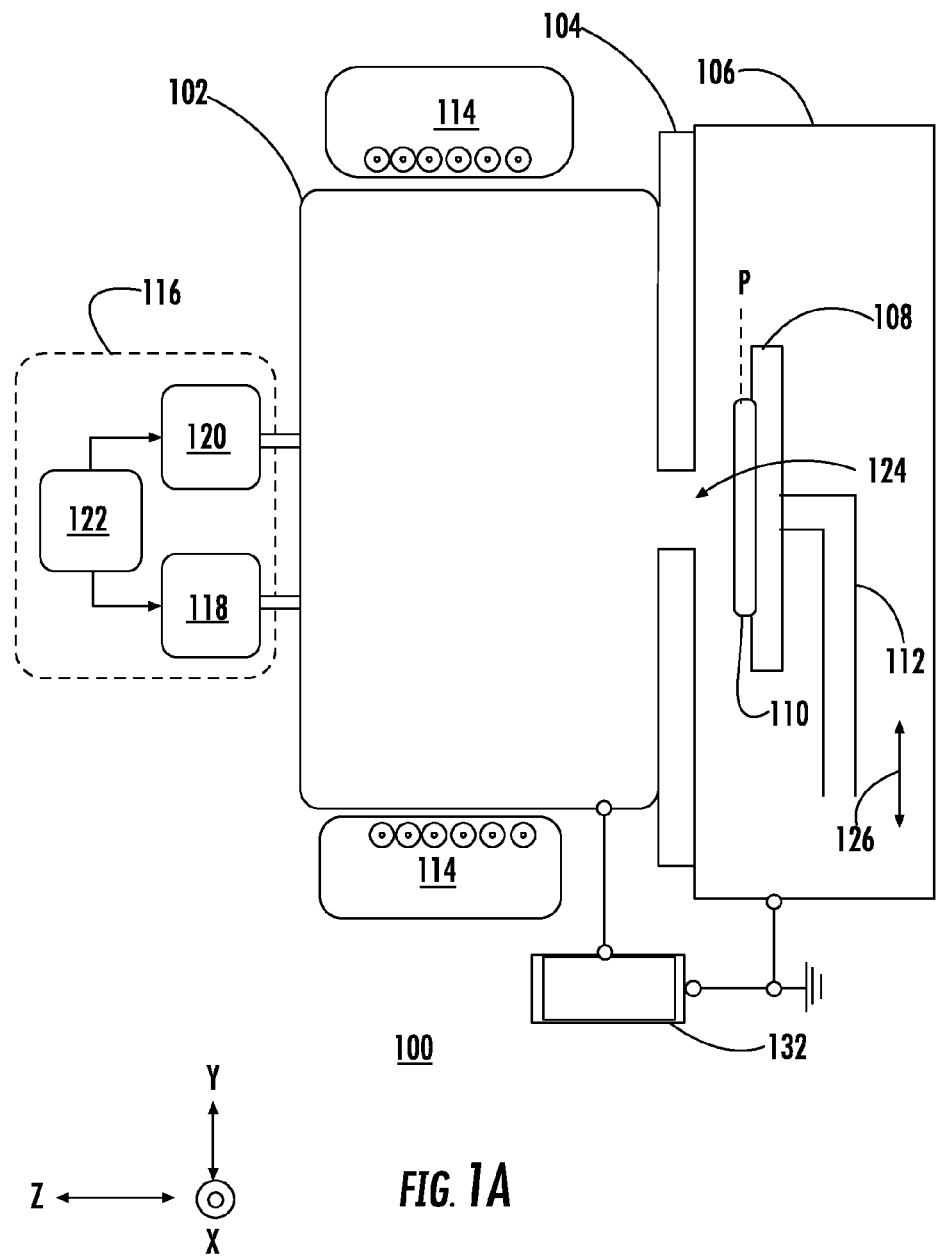
FIG. 1A depicts a processing apparatus according to embodiments of the present disclosure.

The embodiments described herein provide techniques and apparatus for etching metal such as copper to form patterned features. In various embodiments, methods and apparatus to etch copper in an anisotropic fashion are provided. In particular, the copper may be disposed as a pure copper layer or copper alloy layer on a substrate base. The copper layer may be etched in an anisotropic fashion when a mask is in place to form a patterned feature such as an interconnect structure. The copper layer may be initially formed as a blanket layer before etching where the copper layer is composed of crystallites having relatively large grain size at least within a plane of the copper layer. The grain size within the plane of the copper layer may be larger than a dimension of a copper feature after etching. For example, a line width of a copper feature after etching may be less than one half micrometer, while a grain dimension within a plane of the copper layer before etching may be greater than one micrometer. Accordingly, the fabrication techniques for forming patterned copper features that are provided by the present embodiments provide a manner in which resistance may be reduced within a patterned copper feature. This is accomplished by reducing the number of grain boundaries encountered along a length of a patterned feature by fabricating the copper feature initially as a blanket layer where the grain size may be greater in comparison to conventional approaches such as dual Damascene fabrication. In the dual Damascene approach, for example, in order to fabricate a copper feature having a linewidth of 200 nm, copper is deposited within small cavities or trenches that are 200 nm wide. The processes involved in filling such narrow cavities and polishing excess metal to remove the metal where appropriate may inherently limit or reduce the grain size of such metal.

As detailed below, in various embodiments, copper etching is performed by alternately exposing the copper layer to be etched to an ion beam extracted from a plasma chamber and to molecular species that may be provided as a molecular beam of undissociated molecules. In accordance with various embodiments, the ion beam includes reactive ions that generate an altered layer in exposed areas of a copper layer. This may be accomplished by providing the reactive ions at an appropriate energy and ion dose to implant into the copper layer to form an altered layer, for example, in an exposed area of the copper layer. Molecules within a molecular beam that impinge on a surface of the altered layer may then preferentially react with this altered layer to form a volatile product that forms a gas phase species that is removed from the copper layer. By controlling the size and shape of an implant region, that is, the altered layer, material within the exposed area of a copper layer may be removed in a manner that results in an anisotropic etch profile of resulting etched copper features. The ions and molecular species may be directed to a substrate in such a matter that generates an anisotropic etch profile in a copper layer effective to form a copper interconnect having a critical dimension of less than 1000 nm, such as 100 nm or less in one example. The etched copper features may thus be fabricated having shapes and size of copper features that are fabricated by conventional processing, but having the advantage of providing lower resistance by virtue of larger grain size.

FIG. 1A illustrates a processing apparatus 100 consistent with various embodiments of the disclosure. The processing apparatus 100 includes a plasma chamber 102 and an extraction plate 104 disposed along a side of the plasma chamber 102. The extraction plate 104 is disposed between the plasma chamber 102 and a process chamber 106, which is configured to house a substrate holder 108 and substrate 110. As shown in FIG. 1A the substrate holder may be movable with the aid of a stage 112 along the X-axis, Y-axis, or Z-axis, or any combination thereof with respect to the Cartesian coordinate system shown. In various embodiments, the substrate holder 108 may be configured to rotate within the X-Y plane or tilt with respect to the X-Y plane.

The processing apparatus 100 also includes a plasma source 114, which may be used to generate a plasma in the plasma chamber 102. For example, the plasma source 114 may, in various embodiments, be an in situ source or remote source, an inductively coupled plasma source, capacitively coupled plasma source, helicon source, microwave source, arc source, or any other type of plasma source. The embodiments are not limited in this context.

The processing apparatus 100 includes a gas source assembly 116 that includes a gas source 118, which may supply to the plasma chamber 102 oxygen (O2), hydrogen (H2), or nitrogen (N2) gas in some embodiments. As detailed below, the gas supplied from gas source 118 may be used to generate reactive ions in the plasma chamber 102 that are extracted through an extraction aperture 124 and implanted into the substrate 110 to form an altered layer. For example, an extraction voltage may be applied by an extraction voltage supply 132 between the plasma chamber 102 and process chamber 106 to implant ions into the substrate 110.

The gas source assembly 116 may also include a gas source 120, which supplies a molecular gas that may be used to react with an altered layer in the substrate 110 to form a volatile product as described below. The gas source assembly 116 may include a controller 122 that is coupled to the gas source 118 and gas source 120, and is configured to control the providing of gaseous species to the plasma chamber 102.

Figure 1B:
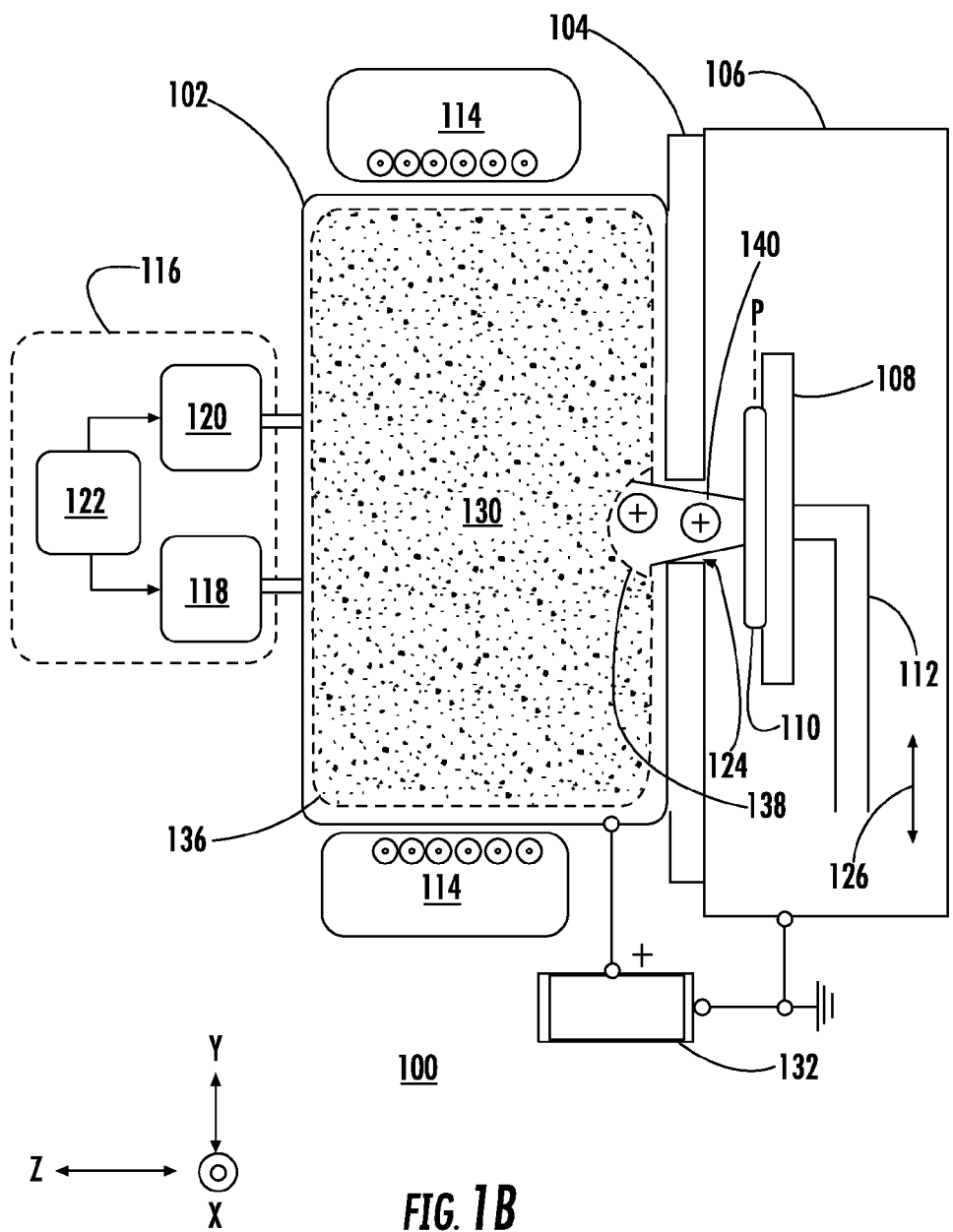
FIG. 1B and FIG. 1C depict details of operation of the processing apparatus of FIG. 1A.

FIG. 1B depicts one instance of operation of the processing apparatus 100 according to an embodiment of the disclosure. In the scenario of FIG. 1B a plasma 130 is generated in the plasma chamber 102. The plasma 130 may be generated when reactive gas is provided from gas source 118. In some examples, the plasma 130 may include oxygen ions, hydrogen ions, or nitrogen ions. However, the embodiments are not limited in this context. In FIG. 1B, the extraction voltage supply 132 may apply an extraction voltage as a positive voltage to the plasma chamber with respect to the process chamber 106 and also the substrate holder 108. This has the effect of attracting positive ions from the plasma 130 to the substrate 110. As shown in FIG. 1B, an ion beam 140 is directed through the extraction aperture 124 and impinges upon the substrate 110. The extraction voltage applied by the extraction voltage supply 132 may be sufficient to cause implantation of ions of the ion beam 140 into the substrate 110 and in particular into a copper layer provided on the substrate 110, as detailed below. In brief, however, the ion beam 140 may generate an altered layer within a copper layer (not shown) disposed on the substrate 110, where the altered layer is composed of a chemically reactive material.

As further shown in FIG. 1B the substrate holder 108 may be scannable along a direction 126 that lies parallel to the Y-axis. In one implementation the extraction aperture 124 may be an elongated slot that has a short dimension, or aperture width, along the Y-axis that is less than the dimension of the substrate 110, as suggested by FIGS. 1A-1C. In contrast, the long dimension of the extraction aperture 124 parallel to the X-axis may be equal to or exceed the dimension of the substrate 110 along the X-axis. Accordingly, when the substrate holder 108 is scanned a sufficient distance along direction 126, the entirety of substrate 110 may be exposed to the ion beam 140.

Figure 1C:
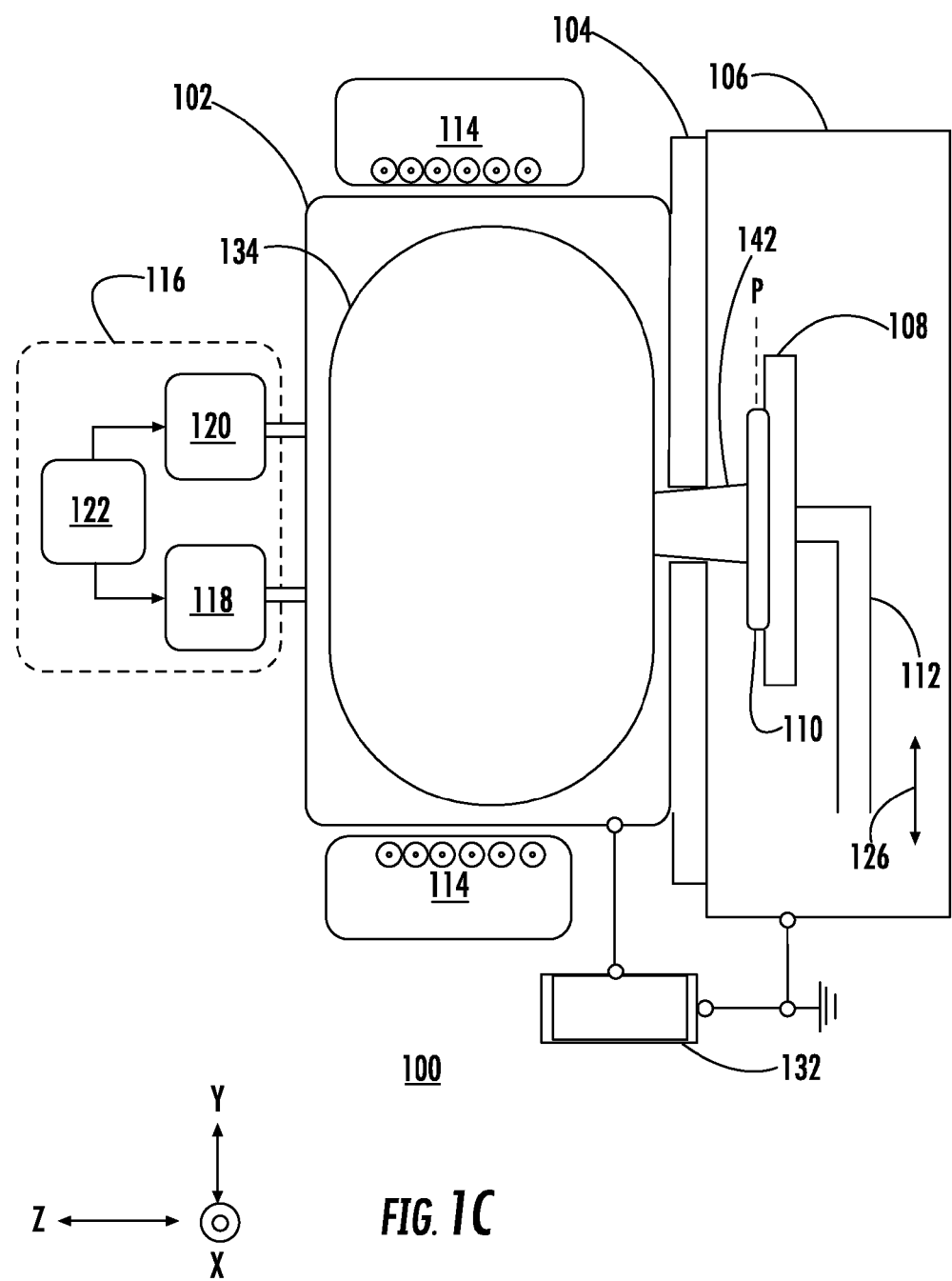

FIG. 1C illustrates another instance of operation of the processing apparatus 100 according to an embodiment of the disclosure. In the scenario of FIG. 1C no plasma 130 is present in the plasma chamber 102. However, the gas source 120 may supply molecular gas 134 to the plasma chamber 102, which may comprise undissociated, as well as non-ionized, molecules. The molecular gas 134 may stream out of the plasma chamber 102 via the extraction aperture 124 as the molecular beam 142, which impacts the substrate 110 as shown. Thus, the plasma chamber 102 may act as a source of ions and as a molecular source. However, in other embodiments, a plasma chamber and molecular source may be separate chambers.

Molecular species within the molecular beam 142 may act as a molecular etchant in which the molecular species are configured to react with reactive material in a copper layer on the substrate 110, creating an etch product that results in removal of the reactive material. In particular, and as detailed below, the molecular beam 142 may provide molecular species that are configured to react with the chemically reactive material formed by ion beam 140 to form a volatile product that may then escape the surface of the substrate 110. Accordingly, the operations illustrated in FIGS. 1B and 1C may constitute an exposure that is effective to etch a copper layer.

Figure 2A:
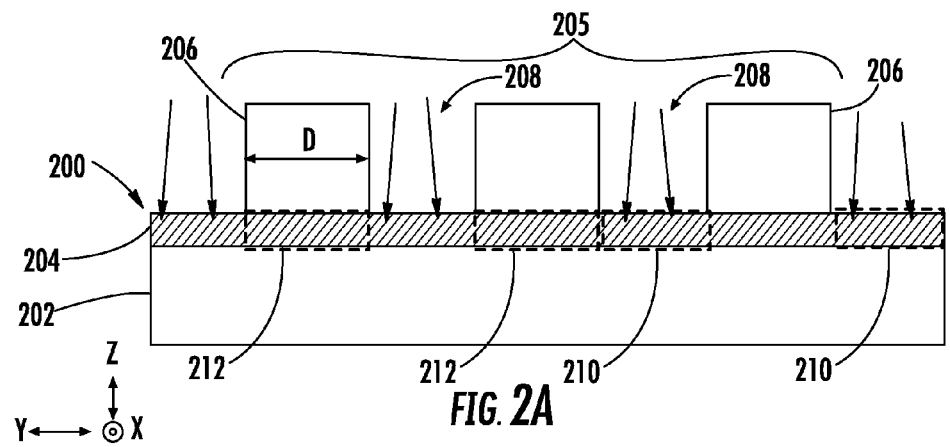
FIG. 2A to FIG. 2D depict a side view of a substrate that illustrate exemplary operations involved in a method for etching a metal layer according to embodiments of the disclosure.
Figure 2B:
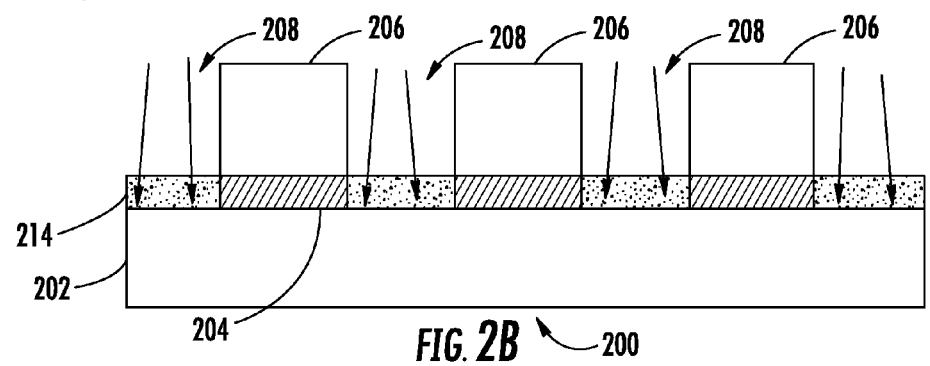
Figure 2C:
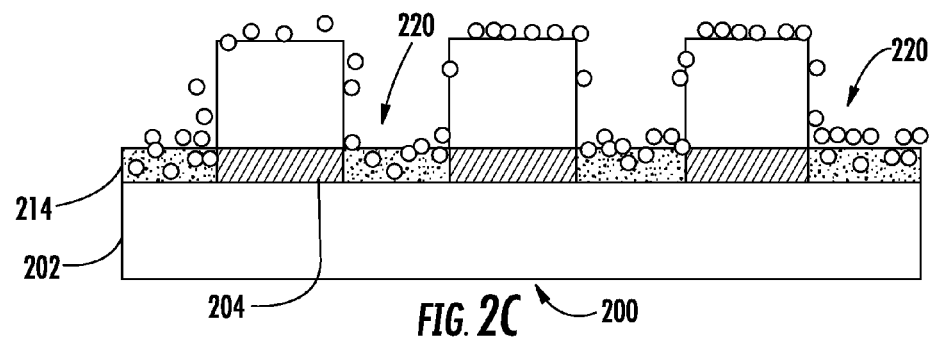
Figure 2D:
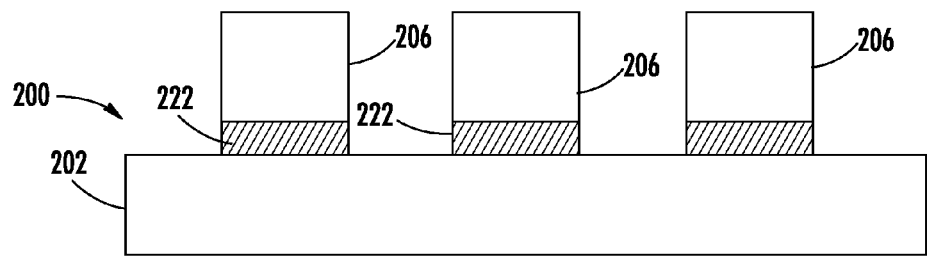
Figure 2E:
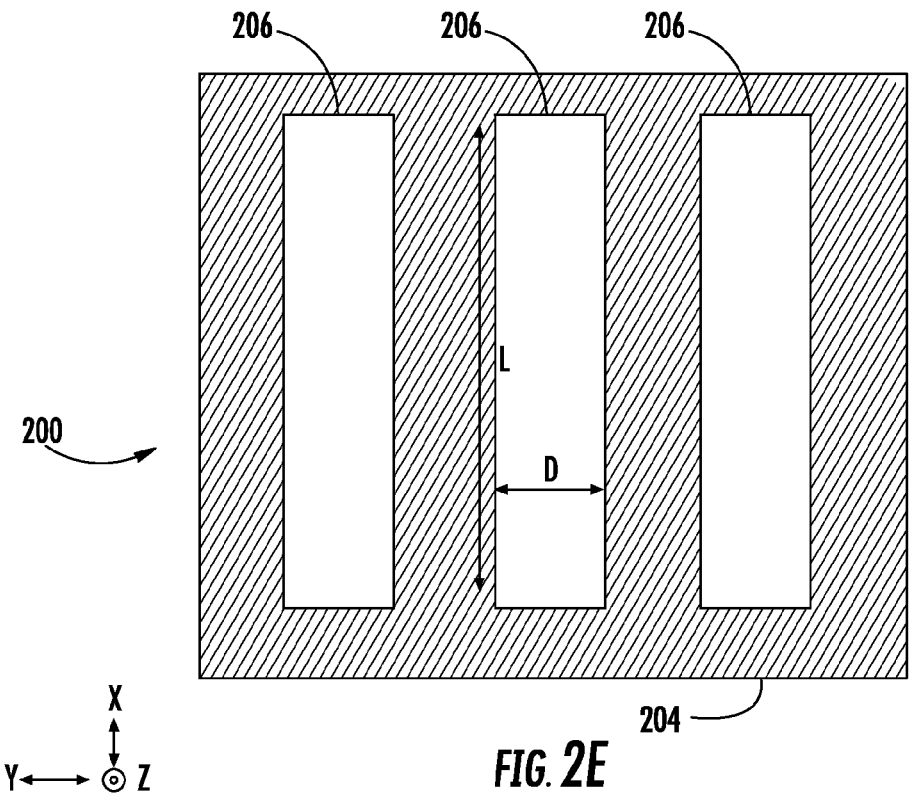
FIG. 2E depicts a top plan view of the substrate corresponding to the instance depicted in FIG. 2A.

FIG. 2A to FIG. 2D depict a side view of a substrate that illustrate exemplary operations involved in a method for etching a metal layer according to embodiments of the disclosure. FIG. 2E depicts a top plan view of the substrate corresponding to the instance depicted in FIG. 2A. In some implementations, the operations depicted in FIGS. 2A-2D may be performed in the processing apparatus 100, although the embodiments are not limited in this context. Turning now to FIG. 2A a substrate 200 is shown, which includes a substrate base 202 upon which a metal layer is disposed. In some implementations the metal layer is a copper layer and will be referred to herein as copper layer 204. The copper layer 204 may be formed as a blanket layer by conventional deposition processes including physical vapor deposition, chemical vapor deposition, plating, or other process. The deposition (not shown) may be carried out in a manner to promote a large crystallite (grain) size at least within the X-Y plane shown. In some examples, the copper layer 204 may serve as the basis for patterned features to be formed such as interconnects in a semiconductor device. The copper layer 204 may have an appropriate thickness in the direction parallel to the Z-axis, such as one micrometer, one half-micrometer, one quarter micrometer, one tenth micrometer, and so forth. However, the embodiments are not limited in this context.

As further illustrated in FIG. 2A, a mask 205 that is composed of a plurality of mask features 206 is provided on the copper layer 204. The mask 205 may be used as an etch mask for etching the copper layer 204 and may be formed from known materials, such as hard mask materials, oxides, nitrides, photoresist, or other mask material. The mask features 206 may in particular serve to define the shape and size of copper features to be etched from the copper layer 204. Thus, the mask features 206 are characterized by a width D and length L, which may correspond to dimensions for copper features to be formed by etching the copper layer 204 when the mask features are present, in a so-called subtractive etch process. One advantage of forming patterned copper features by subtractive etching from a blanket layer, such as copper layer 204 is that the final features formed may retain a grain size characteristic of the copper layer 204 from which they are formed. In some cases, the grain size within the X-Y plane may exceed the width D as well as the length L (see FIG. 2E) of the mask features 206 that may define the planar dimensions of copper features to be formed. Accordingly, after formation of such copper features, the number of grain boundaries that cross a given copper feature may be low, leading to lower grain boundary scattering and therefore higher conductivity of the copper features.

As further shown in FIG. 2A, ions 208 are directed to the substrate 200. The ions 208 may be provided with sufficient energy to implant into exposed areas 210 of the copper layer 204. In some examples the ions 208 may be oxygen, hydrogen, nitrogen, or other reactive ion that may create an altered layer within the exposed areas 210. The instance shown in FIG. 2A may represent an early stage of implantation of the ions 208. Turning now to FIG. 2B there is shown a later stage of implantation of the ions 208 in which a sufficient number of ions 208 have been incorporated into the exposed areas 210 of the copper layer 204 to create an altered layer(s) 214 as shown.

In some instances, the composition of an altered layer 214 may be such that the altered layer 214 is reactive with a molecular species to form a volatile compound. For example, the ions 208 may be oxygen ions in one implementation, and the altered layer 214 may correspond to a $Cu_1O_1$ composition, which represents the CuO composition of a known copper oxide. This type of copper oxide may react with certain molecules to form volatile products which may evaporate from a surface of the copper layer 204. However, the overall composition of the altered layer 214 need not correspond to the exact stochiometry of a crystalline copper oxide in order for the altered layer 214 to be reactive with a given molecular species. Thus, the altered layer 214 may have a composition over a range of Cu/O ratios that is reactive with a molecular species.

As further shown in FIG. 2A and FIG. 2B the mask features 206 may attenuate the ions 208 such that the ions 208 do not implant into the copper layer 204 in the protected areas 212. Thus, after exposure to the ions 208 an undisturbed copper region may be preserved under the mask features 206, which is shown as the copper layer 204 in FIG. 2B.

Once the altered layer 214 has been formed in the exposed areas 210, the exposure to ions 208 may be terminated. Subsequently, the substrate 200 may be exposed to molecular species that are configured to react with the altered layer 214. This is shown in the instance depicted in FIG. 2C. As shown therein, molecular species 220, which may be gas phase species, are provided to the substrate 200, and impinge upon various features of the substrate 200. The molecular species 220 may in particular be composed of at least one molecule that is configured to react with a reactive material of the altered layer 214. Continuing with the example in which the altered layer 214 is CuO, the molecular species 220 may include an acetic acid-based molecule such as an acetylacetonate. In one particular example, the molecular species 220 may be hexafluoroacetlyacetonate (HFAc), which may react with CuO in the altered layer 214 according to:

$$CuO + 2HFAc \rightarrow Cu(HFAc)_2 + H_2O \qquad (1)$$

where $Cu(HFAc)_2$ may be represented as

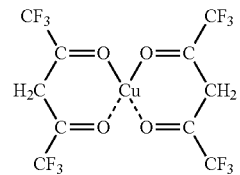

In other embodiments the molecular species may be a non-fluorinated species (HAC) that reacts with the copper to form $Cu(Ac)_2$ where $Cu(Ac)_2$ has the same general structure as $Cu(HFAc)_2$ except that fluorine is replaced by hydrogen. In other embodiments, the molecular species may be an alkane based precursor such as $P(CH_3)_3$ or other Lewis base.

Figure 2F:
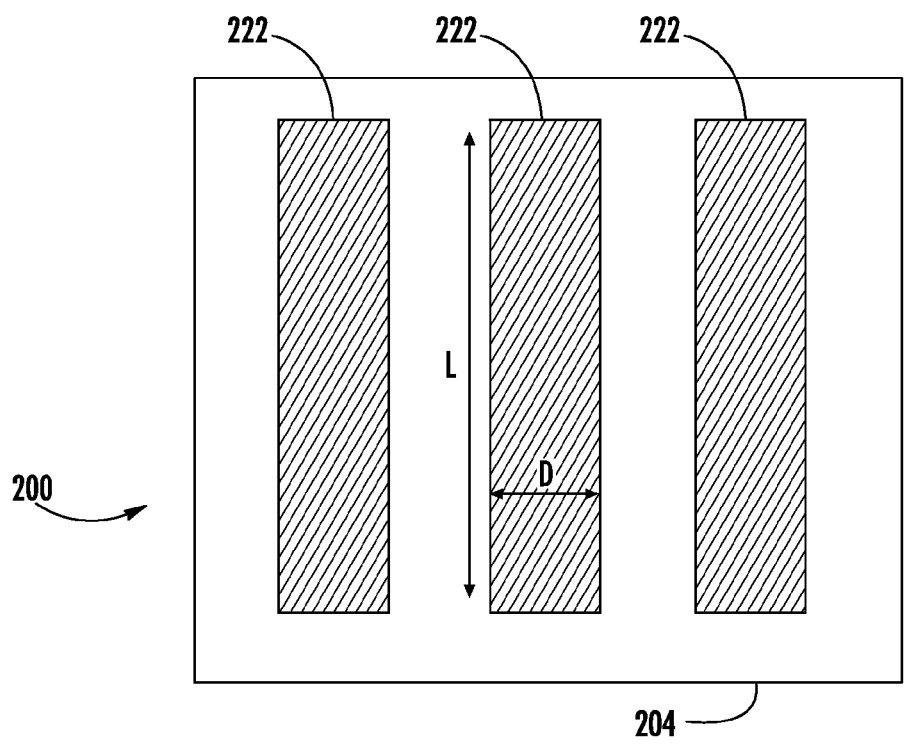
FIG. 2F depicts a top plan view of the substrate of FIG. 2E after processing according to the operations of FIGS. 2A-2D.

These compounds are volatile such that the $Cu(HFAc)_2$ or $Cu(Ac)_2$, for example, may evaporate into the gas phase from the surface of altered layer 214. FIG. 2D depicts an instance after the molecular species 220 have reacted with the altered layer 214. As noted the molecular species 220 and reactive material of the altered layer 214 may react to form a volatile product that is removed from the substrate 200, with a result that the copper layer 204 is removed in the exposed areas 210, as shown. This results in the formation of copper features 222 which may mimic the mask features 206 in size and shape as in other anisotropic etching processes. Subsequently, the mask features may be removed, leaving copper features 222. FIG. 2F depicts a top plan view of the substrate after etching of the copper layer 204 and removal of mask features 206. As illustrated, the copper features 222 may retain the width D as well as the length L (see FIG. 2E) of the mask features 206, which is indicative of a vertical anisotropic etch process.

It is to be noted that in the examples of FIGS. 2A-2D the material used for the mask 205 may be chosen so as not to be unduly etched, sputtered, or altered by implantation from the ions 208 and exposure to the molecular species 220. For example, if the mask features 206 are composed of silicon nitride, implantation of oxygen into the mask features 206 may form a silicon oxynitride, which may be impervious to reaction with an acetylacetonate.

It is further to be noted that the size and shape of the altered layer 214 may be defined by the mask features 206 and the experimental parameters associated with ions 208, such as ion energy, ion dose, ion incidence angle, and so forth. By appropriate selection of these parameters, the degree of anisotropic etching, verticality of sidewalls of copper features 222, and overall dimensions of copper features 222 may be adjusted. Returning to FIGS. 1B and 1C, an advantage of performing the operations shown in FIGS. 2A-2D in an apparatus such as the processing apparatus 100 is that the anisotropic etching of copper features may be performed without breaking vacuum in a single apparatus. However, although the processing apparatus 100 is depicted as having a single chamber that provides both ions and molecular species, in other embodiments, molecular species may be provided from a different chamber. For example, in other apparatus (not shown) the substrate 110 may be exposed to an ion beam while adjacent to a plasma chamber and may be moved to a different position adjacent a molecular chamber to receive exposure to molecular species. In still further embodiments, the ions 208 may be provided to a substrate in a conventional beamline ion implanter, and the molecular species may be provided in a separate apparatus.

Another advantage of using a processing apparatus such as the processing apparatus 100 to perform the operations generally depicted in FIGS. 2A to 2D is that the operations may be repeated in a cyclic fashion multiple times to perform etching of a metal layer such as copper. For example, a copper layer 204 to be etched may have a thickness of 200 nm. Furthermore, it may be convenient to from an altered layer 214 by ion implantation having a thickness of just 10 nm. Accordingly, a 10 nm thick layer of copper may be removed in a single exposure cycle, where the single exposure cycle is composed of an exposure to an ion beam to generate a 10 nm thick altered layer, and an exposure to a molecular beam that is effective to remove the 10 nm thick altered layer. This exposure cycle may be repeated approximately 20 times to remove a 200 nm film.

Although the aforementioned embodiments detail examples in which the altered layer 214 is composed of copper oxide, in other embodiments an altered layer may be composed of a reactive material such as a hydride. Thus, in additional embodiments hydrogen ions such as molecular or atomic hydrogen ions may be implanted into exposed areas of a copper layer to form a copper hydride in one operation. In a subsequent operation, a molecular species such as HAc, HFAc, cyclopentadienyl, arsine, trimethylarsine, phosphine, or trimethylphosphine may be provided to the surface of the copper hydride, which may form a volatile product that results in etching of the copper layer in the exposed areas. In particular implementations, the arsine, trimethylarsine, phosphine, or trimethylphosphine molecular species may be provided optionally with a ligand such as cyclopentadienyl, or other cyclic, aromatic, alkene or alkyne ligand to generate a volatile etch product. The embodiments are not limited in this context.

FIG. 3A to FIG. 3D depict exemplary operations involved in a method for etching a metal layer in which an exposure cycle composed of ion implantation and exposure to a molecular etchant is repeated in cyclic fashion. In this manner, as discussed above, a metal layer may be etched incrementally, which may be useful under circumstances in which the thickness of a metal film to be removed exceeds the implantation range that is conveniently accessible by a processing apparatus. Moreover, even in circumstances where a processing apparatus may be capable of implanting reactive ions through an entire thickness of a metal layer it may nevertheless be desirable to implant incrementally into a thinner portion of the metal layer. By reducing the implant depth in a given ion treatment, the lateral straggle of ions is also reduced. This lateral straggle, if excessive, may compromise the ability to control the lateral dimensions of an altered layer to be removed.

In the particular example of FIGS. 3A to 3D, two exposure cycles are shown. However, in other embodiments, a greater number of exposure cycles may be performed, which may be tailored according to the thickness of a metal layer to be etched, the reactive ion used to implant the metal layer, and other considerations. Moreover, in the example of FIGS. 3A to 3D, instead of repeating the same ion implantation process in each exposure cycle, the ion implantation conditions are varied between different exposure cycles. In particular examples, the ion angular distribution of ions directed to a metal layer may be varied between successive exposure cycles. This may provide a finer control over an etch profile of a metal film to be etched, as detailed below.

Figure 3A:
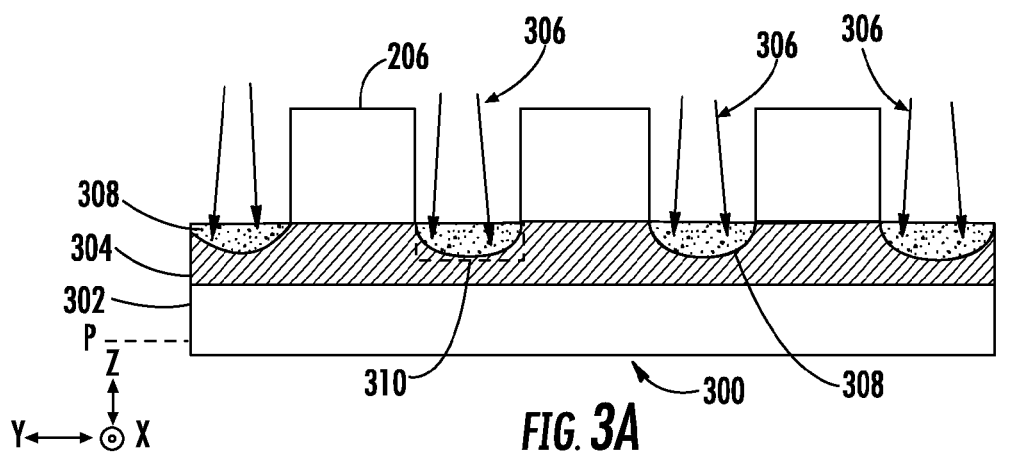
FIG. 3A to FIG. 3D depict exemplary operations involved in a method for etching a metal layer according to further embodiments of the disclosure.

In FIG. 3A a substrate 300 is illustrated, which includes a substrate base 302. For the purposes of illustration it may be assumed that a copper layer 304 is formed on the substrate base 302. Mask features 206 as described above are also provided on the copper layer 304 to define a pattern of copper features to be formed. It may also be assumed that the substrate 300 is subject to ion implantation in an apparatus such as the processing apparatus 100. Returning also to FIG. 1B, the extraction plate 104 may be configured to modify the shape of a plasma sheath boundary 136, such that a meniscus 138 is formed adjacent the extraction aperture 124, as in known extraction plate apparatus. This may cause ions that are extracted from the plasma 130 through the extraction aperture 124 to exit the plasma 130 over a range of angles that are defined by an ion angular distribution. The term "ion angular distribution" refers to the mean angle of incidence of ions in an ion beam with respect to a reference direction such a perpendicular to a substrate, as well as to the width of distribution or range of angles of incidence centered on the mean angle, termed "angular spread" for short. The ion angular distribution may involve a mean angle for ion trajectories of the ion beam that forms a non-zero angle with respect to a perpendicular to the plane P of the substrate, where the perpendicular lies parallel to the Z-axis.

In various embodiments, the ion angular distribution of an ion beam may be adjusted by adjusting, alone or in combination, settings of a processing apparatus such as processing apparatus 100. These settings may include RF power supplied to a plasma chamber that generates the ions, extraction voltage used to accelerate ions to a substrate, gas pressure in the plasma chamber, extraction aperture width, and other settings.

In the example of FIG. 3A, an ion beam 306 is provided to the substrate having a first ion angular distribution, which is represented schematically by the arrows. As noted, this ion angular distribution may be characterized by a mean angle of incidence as well as an angular spread. In some instances an extraction plate may be configured to generate a bimodal ion angular distribution in which a maximum number of ions are directed to a substrate at two different angles of incidence. For example a bimodal distribution may be characterized by a peak in the number of ions having trajectories whose angle of incidence is located at +/−20 degrees, where 0 degrees incidence is parallel to the Z-axis shown in FIG. 3A. In any case, a portion of ions in the ion beam 306 may be directed at trajectories that form a non-zero angle with respect to the Z-axis. This may be useful to tailor the shape of an implantation region and thus the shape of an altered layer that may be formed by the implantation of reactive ions. As shown in FIG. 3A, ions of the ion beam 306 may be provided with an ion energy and an ion dose to form an altered layer 308 in exposed areas 310 of the copper layer 304. In particular, the ion energy and ion dose of the ion beam 306 that is provided to the substrate 300 may generate an altered layer 308 that does not extend through the entire thickness of the copper layer 304. In some examples, the ions of ion beam 306 may be oxygen ions, and the altered layer 308 may be composed of CuO. Moreover, the shape of the altered layer 308 adjacent the mask features 206 may not exhibit a vertical profile that is parallel to the Z-axis.

Figure 3B:
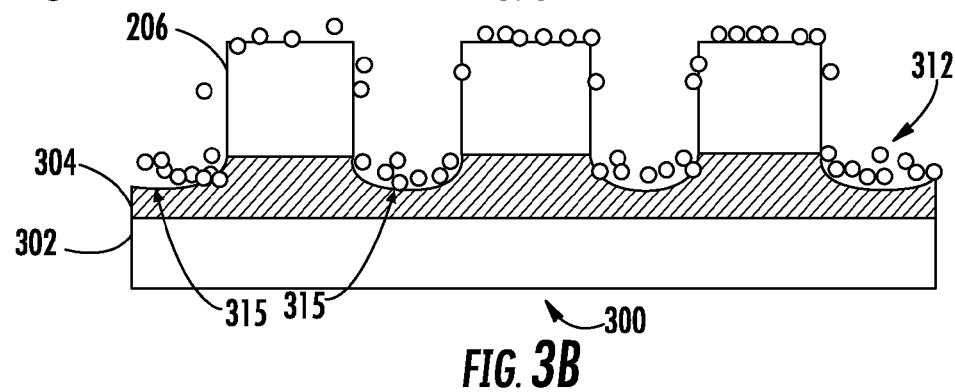

FIG. 3B depicts a subsequent operation in which molecular species 312 are provided that act as a molecular etchant to react with the altered layer 308 and generate a volatile etch product as discussed above. For example, an acetylacetonate molecular species may be provided to react with the altered layer 308 to create a copper acetonate product that is volatile. This results in the removal of the altered layer 308 as shown in FIG. 3B. However, in order to define isolated copper features that are etched completely to the substrate base 302, further copper etching is to take place. Moreover, the shape of the etched regions 315 of the copper layer may be such that the sidewalls are angled or curved with respect to the Z-axis. Accordingly, it may be desirable to adjust ion treatment in a subsequent ion implantation operation to account for this.

Figure 3C:
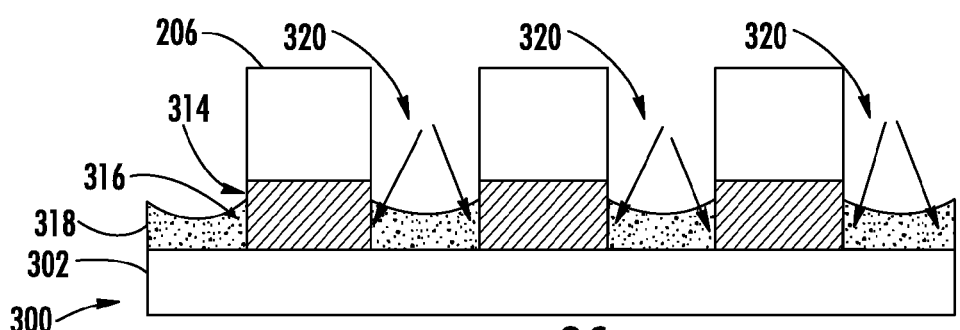

In a next exposure cycle, which may commence with another ion implantation procedure, the ion angular distribution of ions may be adjusted from that of the ion beam 306. FIG. 3C depicts an instance in which an ion beam 320 is directed to the substrate 300. After sufficient time, the ion beam 320 may create an altered layer 318 that extends through the remaining thickness of the copper layer 304 in the exposed areas 310 (see FIG. 3A). In addition, as schematically shown by the arrows, the ion beam 320 exhibits a different ion angular distribution than that of ion beam 306. In particular, the ion beam 320 may provide ions having trajectories that direct ions into corner regions 316 to generate an altered layer 318 that serves to define a more vertical profile for a sidewall 314 of a copper feature being formed.

Figure 3D:
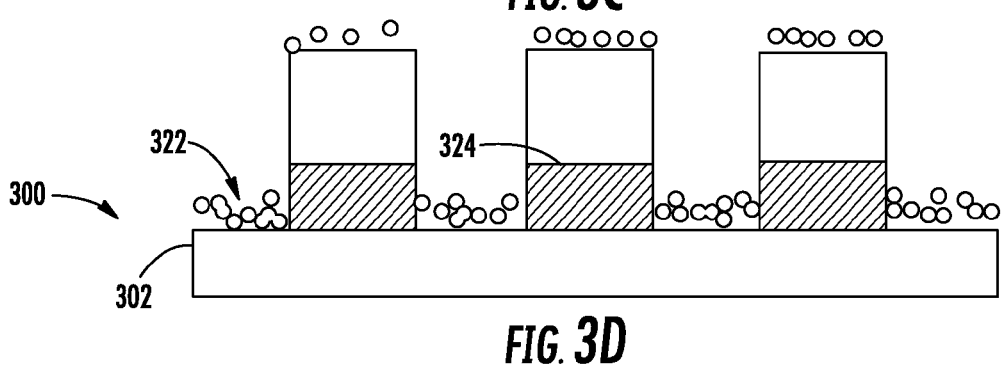

FIG. 3D depicts a subsequent operation in which molecular species 322 are provided that act as a molecular etchant to react with the altered layer 318 and generate a volatile etch product as discussed above. Thus, the adjustment of the ion angular distribution for ion beam 320 may result in a vertical shape to the final copper features formed, which are shown as copper features 324.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method for etching a copper layer disposed on a substrate, comprising:
    directing an ion beam comprising reactive ions to the substrate when a mask that defines an exposed area and protected area is disposed on the copper layer, wherein an altered layer is generated in the exposed area comprising a chemically reactive material; and
    exposing the copper layer to a molecular species that is effective to react with the chemically reactive material so as to remove the altered layer, wherein the directing the ion beam comprises:
    providing an extraction plate between the substrate and a plasma chamber that contains a plasma comprising the reactive ions; and
    extracting the reactive ions through an extraction aperture of the extraction plate.

2. The method of claim 1, wherein the reactive ions comprise oxygen.

3. The method of claim 1, wherein the molecular species is an acetic acid based species.

4. The method of claim 3, wherein the molecular species comprises an acetylacetonate.

5. The method of claim 3, further comprising providing the ions at an ion dose and ion energy to form a CuO composition within the altered layer.

6. The method of claim 1, wherein the reactive ions comprise hydrogen.

7. The method of claim 6, wherein the molecular species comprise arsine, trimethylarsine, phosphine, or trimethylphosphine.

8. The method of claim 6, wherein the molecular species further comprises an aromatic, cyclic, alkene or alkyne ligand.

9. The method of claim 1, wherein the extraction plate modifies a shape of a plasma sheath boundary proximate the extraction aperture, and wherein at least some of the reactive ions are directed to the substrate over trajectories that form a non-zero angle with respect to a perpendicular to a substrate plane.

10. The method of claim 9, wherein the reactive ions and the molecular species are alternately supplied to the substrate from the plasma chamber.

11. The method of claim 1, wherein directing the ion beam and the exposing the copper layer to molecular species comprise a first exposure cycle, the method further comprising performing a plurality of exposure cycles, wherein copper is removed from the exposed area in each exposure cycle of the plurality of exposure cycles.

12. The method of claim 11, wherein an ion angular distribution of the ion beam is varied between a first exposure cycle and a second exposure cycle.

* * * * *